United States Patent [19]
Dornberger et al.

[11] Patent Number: 6,015,460
[45] Date of Patent: Jan. 18, 2000

[54] METHOD AND APPARATUS FOR PULLING A MONOCRYSTAL

[75] Inventors: Erich Dornberger; Wilfried Von Ammon, both of Burghausen, Germany

[73] Assignee: Wacker Siltronic Gesellschaft fur Halbleitermaterialien AG, Burghausen, Germany

[21] Appl. No.: 09/039,068

[22] Filed: Mar. 13, 1998

Related U.S. Application Data

[62] Division of application No. 08/744,544, Nov. 6, 1996, Pat. No. 5,759,261.

[30] Foreign Application Priority Data

Dec. 15, 1995 [DE] Germany ............................ 195 46 987

[51] Int. Cl.⁷ .................................................. C30B 35/00
[52] U.S. Cl. .................................................. 117/217
[58] Field of Search .............................. 117/34, 217, 222, 117/900

[56] References Cited

U.S. PATENT DOCUMENTS

| | | |
|---|---|---|
| 4,078,897 | 3/1978 | Jericho . |
| 5,361,721 | 11/1994 | Takano et al. ..................... 117/214 |
| 5,578,123 | 11/1996 | Vilzmann et al. .................. 117/13 |

FOREIGN PATENT DOCUMENTS

| | | |
|---|---|---|
| 1420234 | 1/1965 | France . |
| 56-134376 | 10/1981 | Japan . |
| 59-57992 | 4/1984 | Japan . |
| 63-147891 | 6/1988 | Japan . |
| 5-221786 | 8/1993 | Japan . |
| 5-294783 | 11/1993 | Japan . |

*Primary Examiner*—Felisa Hiteshew
*Attorney, Agent, or Firm*—Collard & Roe, PC

[57] ABSTRACT

A method and an apparatus for pulling a silicon monocrystal from a melt includes the pulling of a conical portion in each case at the beginning and at the end of the monocrystal and the pulling of a cylindrical portion between the conical portions. In this method, the surface of the conical portion at the beginning of the monocrystal is shielded by a shielding means spaced apart from the monocrystal.

8 Claims, 2 Drawing Sheets

METHOD AND APPARATUS FOR PULLING A MONOCRYSTAL

This application is a divisional of 08/744,544 filed on Nov. 6, 1996, now U.S. Pat. No. 5,759,261.

BACKGROUND OF THE INVENTION

1. Field of the Invention

The present invention relates to a method for pulling a silicon monocrystal from a melt, comprising the pulling of one conical portion in each case at the beginning and at the end of the monocrystal and the pulling of a cylindrical portion between the conical portions. In addition, the invention also relates to an apparatus for carrying out the method.

2. The Prior Art

The invention is an improvement in the method known by the name "Czochralski method" for producing monocrystals. According to this method, a seed crystal which has previously been immersed in a melt is pulled away from the melt surface at a defined speed, such that an ingot-shaped monocrystal grows on the lower side of the seed crystal. After a so-called thin neck has been pulled, the diameter of the growing monocrystal is first increased so that a conical portion, the so-called initial cone, is produced. After the initial cone, the diameter of the growing monocrystal is kept constant and a cylindrical portion is pulled. Finally, the diameter of the monocrystal is reduced again. The portion produced thereby at the end of the monocrystal is referred to as the end cone. Changes in the monocrystal diameter are substantially due to changes in the pulling speed and to changes in the temperature conditions in the melt, in particular in the region of the crystallization boundary.

In the past, it was usual to cut away the initial cone, to cut away a 30 to 50 mm long portion of the cylindrical portion adjacent to the initial cone, and to cut away the final cone from the monocrystal. Then only the cylindrical main part of the monocrystal could be cut into semiconductor wafers. In the case of relatively short monocrystals having a relatively large diameter in the cylindrical portion, this procedure meant discarding an appreciable part of the potentially usable crystal material.

If that part of the cylindrical portion which adjoins the initial cone is nevertheless cut into semiconductor wafers, an annular region (stacking fault ring) in which oxidation-induced stacking faults occur in high density can be detected on the wafers. The manufacturers of electronic components prefer, however, semiconductor wafers with as low a stacking fault density as possible. Semiconductor wafers having a stacking fault ring are therefore considered inferior.

It is now known that the diameter of the stacking fault ring is proportional to the pulling speed with which the monocrystal was pulled, and in particular, at the instant in time when the semiconductor material which comprises the semiconductor wafer produced later crystallized. At a certain pulling speed, the stacking fault ring disappears, as it were, because its diameter coincides with the diameter of the future semiconductor wafer. An attempt is therefore made to reach this pulling speed quickly during the pulling of the monocrystal in order to limit the occurrence of the stacking fault ring to the initial cone and to as short a part as possible of the adjacent cylindrical portion. This is achieved, however, only to an inadequate extent. In addition, it is known that the breakdown strength of oxide films, which is referred to in specialist jargon as gate-oxide integrity (GOI) and is an important criterion in assessing the quality of semiconductor wafers, is dependent on the pulling speed in an indirectly proportional manner.

SUMMARY OF THE INVENTION

It is an object of the present invention to provide an improved method for the production of silicon monocrystals which have a cylindrical portion which can be cut almost completely into qualitatively high-grade semiconductor wafers without a stacking fault ring.

This above object is achieved according to the present invention by a method which comprises shielding the surface of the conical portion at the beginning of the monocrystal with a shielding means which is spaced apart from the monocrystal.

The shielding means impedes the free heat radiation from the surface of the initial cone into the environment. As the inventors have discovered, the reduced heat radiation has the effect that the diameter of the stacking fault ring readily coincides with the diameter of the growing monocrystal even at lower pulling speeds. This result was not possible in the prior art. At the same time, the length of that part of the cylindrical portion which is adjacent to the initial cone and which still has a stacking fault ring is reduced by at least 50%. The reduced pulling speed also produces an improvement in the tested GOI values. The GOI is markedly poorer in comparable semiconductor wafers if the semiconductor wafers originate from that part of the cylindrical portion which is adjacent to the initial cone and if the monocrystal has been pulled without the initial cone being shielded in accordance with the present invention. This is also the case if the semiconductor wafers have no stacking fault ring because the monocrystal had already been pulled at a sufficiently high speed at the instant in time when this part of the cylindrical portion was produced.

In the implementation of the invention, the surface of the initial cone is thermally shielded with a shielding means during the pulling of the monocrystal. The shielding means reduces the heat radiation from the surface of the initial cone. The shielding means is responsible for the fact that the temperature drop between the crystallization boundary and the already crystallized part of the initial cone is small. The shielding means should not, however, come into contact with the growing monocrystal because dislocations could be induced in the monocrystal on contact. The distance between the shielding means and the surface of the initial cone is from 5 mm to 200 mm, and preferably is from 10 mm to 100 mm.

Since the distance between the initial cone and the melt surface changes during the crystal pulling, the shielding means must be movable in the direction of the longitudinal axis of the monocrystal. It can then be brought to the planned position above the surface of the initial cone and kept at the planned distance from the surface of the initial cone. The shielding means is preferably positioned at the beginning of the pulling of the initial cone. Of course, the shielding means can be brought to the planned position even before this instant in time or shortly after it. The initial cone is shielded by the shielding means at least until a part of the cylindrical portion of the monocrystal having a length of from 20 mm to 100 mm long has been pulled. The shielding means should shield at least 20% to 100% of the surface of the initial cone, with this per cent relating to the completely pulled initial cone.

To intensify the shielding action, the shielding means may also additionally project beyond the periphery of the monocrystal. The shielding means should be made from a material which remains stable under the conditions prevailing during the pulling of the monocrystal and which does not constitute any danger of contamination for the growing monocrystal.

Preferably, the shielding means is made from a material such as graphite, silicon or quartz or is coated with one of these substances. Particularly preferred is a shielding means made of graphite-sheathed graphite felt.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing, wherein similar reference characters denote similar elements throughout the several views.

DETAILED DESCRIPTION OF PREFERRED EMBODIMENTS

Figure 1:
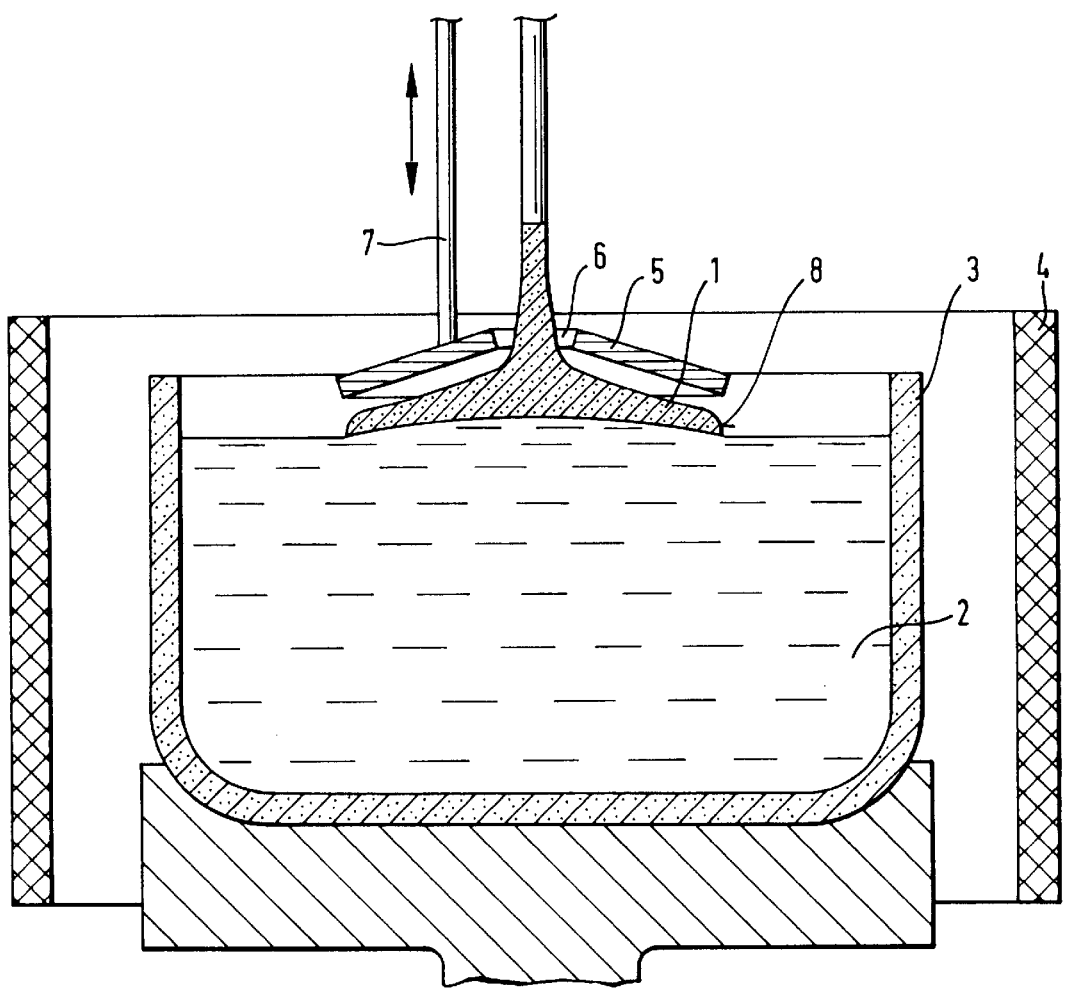
FIG. 1 shows a partial section side view of an apparatus for pulling silicon monocrystals.

Turning now in detail to the drawings, FIG. 1 shows the initial cone 1 of the monocrystal having already been pulled from the melt 2. The melt 2 fills a crucible 3 which is surrounded by a heating element 4. The surface of the initial cone is substantially shielded by a shield or shielding means 5 disposed above it at a defined distance. The shielding means has a central opening 6 through which the "thin neck" of the monocrystal projects. The opening 6 gives the shielding means the appearance of a circular disc or of a cone with the tip thereof having been removed. That area of the shielding means which is situated opposite the initial cone may, as shown in FIG. 1 be almost parallel to the surface of the initial cone.

It is, however, also possible for the two surfaces to be at a defined angle to one another. Furthermore, the shielding means is disposed in such a way that it can be moved perpendicularly to the surface of the melt. In the embodiment shown, the shielding means is linked for this purpose with an axially displaceable rod 7. Of course, however, other equivalent structures may also be used to achieve the movability of the shielding part.

Figure 2A:
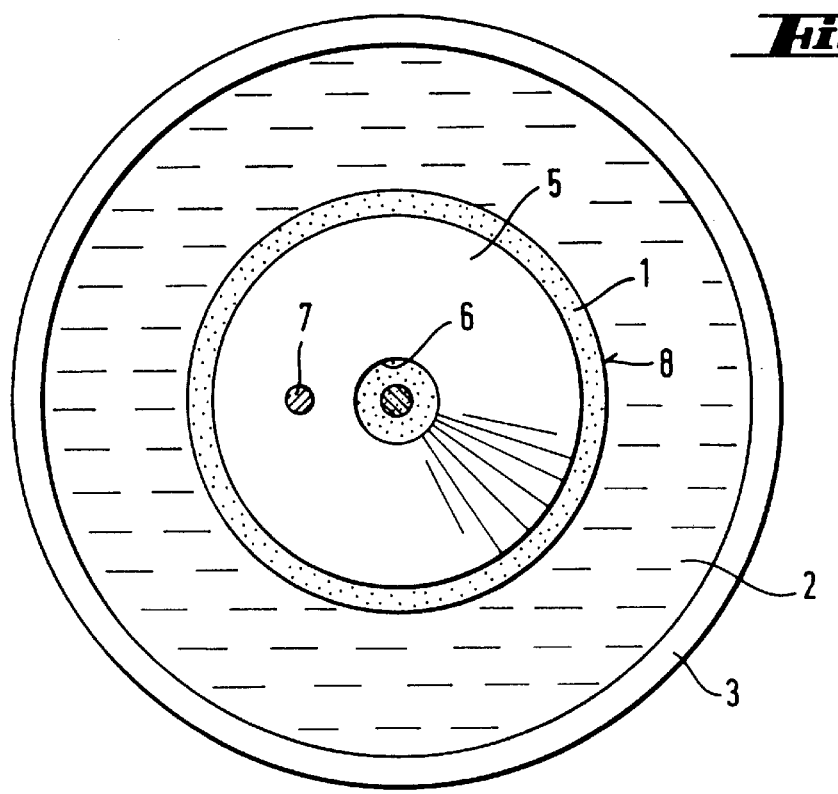
FIGS. 2a and 2b show a top view of the initial cone of a growing monocrystal.
Figure 2B:
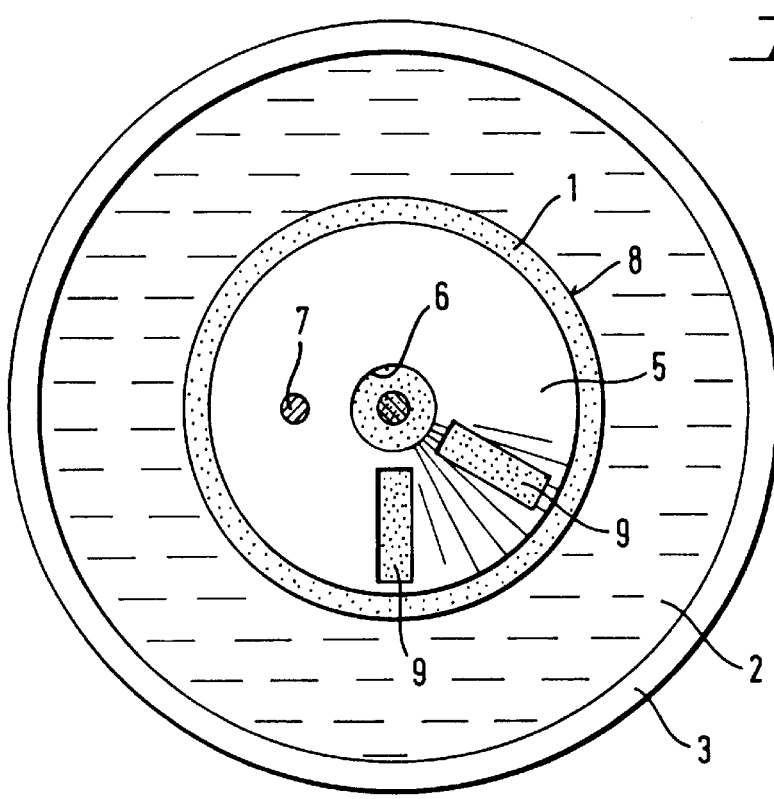

From FIGS. 2a and 2b, it can be seen that the surface of the initial cone does not have to be completely covered by the shielding means. In the drawing, a peripheral region 8 of the initial cone projects beyond the periphery of the shielding means 5. However, it is also possible to provide the shielding means with a much larger diameter, so that the shielding means 5 also appears to shield the peripheral region 8 from the perspective shown.

The shielding means 5 shown in FIG. 2b additionally has two viewing slits 9 in the form of cutouts. Such viewing slits are provided in order to be able to observe the visible part of the crystallization boundary and to be able to check the current diameter of the monocrystal while the monocrystal is being pulled. If two viewing slits are present, one can be utilized to observe by means of a camera and the second for observation by the operator of the pulling system. A further advantage of viewing slits is that the shielding means can be brought to the planned position even at the beginning of the pulling of the initial cone. Without viewing slits, it may be necessary for the shielding means to be moved only gradually in the direction of the growing initial cone. This is because a defined minimum distance above the initial cone must initially be maintained in order to be able to view the crystallization boundary past the periphery of the shielding means.

The shielding means shown are only preferred embodiments. It is clear that the initial cone can also be shielded by a shielding means of a different shape, which may also be composed of two or more individual parts.

While several embodiments of the present invention have been shown and described, it is to be understood that many changes and modifications may be made thereunto without departing from the spirit and scope of the invention as defined in the appended claims.

What is claimed is:

1. An apparatus for pulling a silicon monocrystal from a melt, said monocrystal having a conical portion at a beginning of said monocrystal, comprising a shielding means which is spaced apart from the monocrystal and which shields a surface of the conical portion at the beginning of the monocrystal, said shielding means being provided with a central opening and with at least one cutout through which the surface of the conical portion at the beginning of the monocrystal is observable.

2. The apparatus as claimed in claim 1, comprising means for movably mounting the shielding means and for varying its distance from a surface of the conical portion and from a surface of the melt.

3. The apparatus as claimed in claim 1, wherein the shielding means is composed of a material selected from the group consisting of graphite, graphite-sheathed graphite felt, silicon and quartz.

4. The apparatus as claimed in claim 1, wherein the shielding means is coated with a material selected from the group consisting of graphite, graphite-sheathed graphite felt, silicon and quartz.

5. The apparatus as claimed in claim 1, wherein the distance between the shielding means and the surface of the conical portion at the beginning of the monocrystal is from 5 mm to 200 mm.

6. The apparatus as claimed in claim 1, wherein the shielding means has the shape of a circular disc.

7. The apparatus as claimed in claim 1, wherein the shielding means has the shape of a cone having a removed tip.

8. An apparatus for pulling a silicon monocrystal from a melt, said monocrystal having a conical portion at a beginning of said monocrystal, comprising a shielding means which is spaced apart from the monocrystal and which shields a surface of the conical portion at the beginning of the monocrystal, said shielding means being provided with a central opening and with means for vertically moving said shielding means independently of the monocrystal.

* * * * *